(12) United States Patent
Tai et al.

(10) Patent No.: US 6,432,728 B1
(45) Date of Patent: Aug. 13, 2002

(54) METHOD FOR INTEGRATION OPTIMIZATION BY CHEMICAL MECHANICAL PLANARIZATION END-POINTING TECHNIQUE

(75) Inventors: Shuo-Yen Tai, Kaoshon; Ming-Cheng Yang, Taipei; Jiun-Fang Wang; Champion Yi, both of Hsin-Chu, all of (TW)

(73) Assignee: ProMOS Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/687,163

(22) Filed: Oct. 16, 2000

(51) Int. Cl.⁷ .............................................. H01L 21/00
(52) U.S. Cl. ................ 438/5; 438/7; 438/12; 438/285; 438/692
(58) Field of Search .................... 438/5, 7, 12, 692; 451/5, 6, 285

(56) References Cited

U.S. PATENT DOCUMENTS

| | | | |
|---|---|---|---|
| 5,222,329 A | * 6/1993 | Yu | |
| 5,868,896 A | 2/1999 | Robinson et al. | ............ 156/344 |
| 5,985,679 A | 11/1999 | Berman | ......................... 438/7 |
| 6,020,264 A | 2/2000 | Lustig et al. | ................ 438/692 |
| 6,074,517 A | 6/2000 | Taravade | .................... 156/345 |

* cited by examiner

*Primary Examiner*—Wael Fahmy
*Assistant Examiner*—D. M. Collins
(74) *Attorney, Agent, or Firm*—George O. Saile; Stephen B. Ackerman

(57) ABSTRACT

A new method is provided for determining the optimum film thickness of a film that is to be deposited over a semiconductor surface. The invention observes the electrical current and the therefrom resulting torque that is supplied to a rotating part of a polishing apparatus, from this the CMP end-point can be determined for a reference film that has been deposited. This technique is known as the "CMP end-point detection" technique. The invention addresses observing CMP end-point curves for films of various thicknesses and compares these CMP end-point curves of one film thickness with each other and calculates a deviation for multiple layers (deposited on different wafers) of that film thickness. The process is repeated for different film thickness. The film thickness that has a deviation of the CMP end-point curve that closest resembles an optimum deviation is the film thickness that is selected as having the optimum thickness for the deposition of that film.

11 Claims, 3 Drawing Sheets

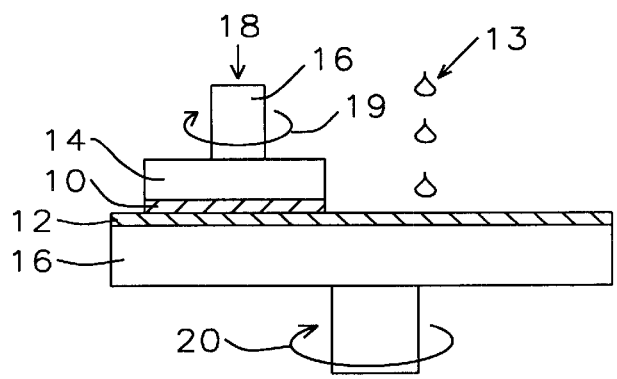
FIG. 1 – Prior Art
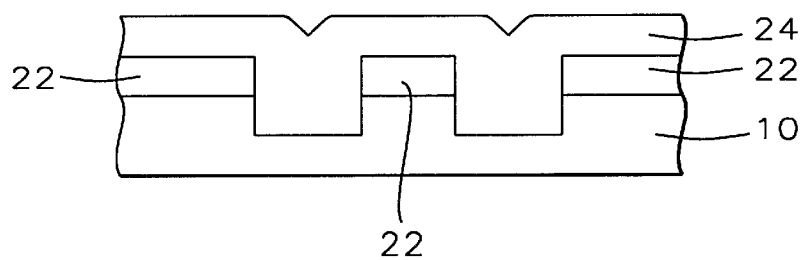
FIG. 2a – Prior Art
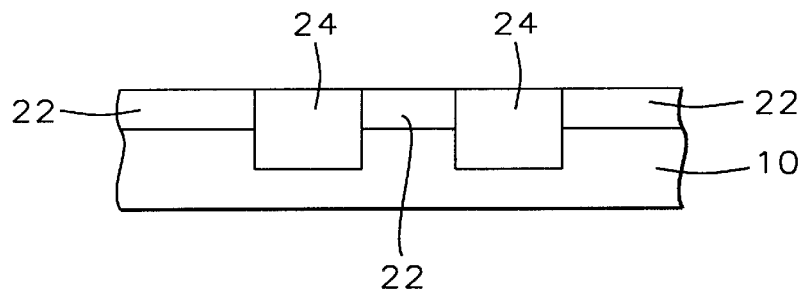
FIG. 2b – Prior Art
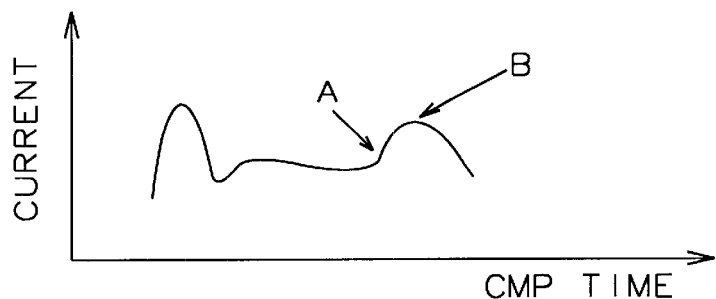
FIG. 3

METHOD FOR INTEGRATION OPTIMIZATION BY CHEMICAL MECHANICAL PLANARIZATION END-POINTING TECHNIQUE

BACKGROUND OF THE INVENTION (1) Field of the Invention

The invention relates to the fabrication of integrated circuit devices, and more particularly, to a method of optimizing pre-layer film thickness by using Chemical Mechanical Polishing (CMP) end-point detection signals.

(2) Description of the Prior Art

The continued emphasis on semiconductor device miniaturization, leading to the technological evolution of Large Scale Integration (LSI), Very Large Scale Integration (VLSI) and Ultra Large Scale Integration (ULSI), has over the years resulted in inter-linear device distances that have become increasingly short. One of the predominant technologies that is used for the creation of semiconductor devices is the technology of photolithography which uses, with and in support of other developments in the semiconductor industry, ever shallower focal depths to create images in target surfaces. As a result of this ever shallower image depth, the target surfaces must be created with increased flatness. If a large step (an abrupt change in the planar geometry of the surface) is present in the semiconductor surface, step coverage is negatively affected. This results in a gradation of the surface that is too severe and causes poor deposition of for instance an overlying layer of metal, making it difficult to achieve a reliable semiconductor device. Increased semiconductor device density is frequently implemented using multi-layered configurations, which further leads to demands of increased planarity of the surface over which additional semiconductor device features are created. One of the main techniques that have been used in the semiconductor industry to achieve optimum surface planarity is the method of Chemical Mechanical Polishing (CMP). Chemical Mechanical Polishing is a method of polishing materials, such as semiconductor substrates, to a high degree of planarity and uniformity. The process is used to planarize semiconductor slices prior to the fabrication of semiconductor circuitry thereon, and is also used to remove high elevation features created during the fabrication of the microelectronic circuitry on the substrate.

A CMP apparatus comprises a rotating polishing platen on which a polishing pad is mounted. A second rotating part, typically referred to as the wafer carrier part, holds a wafer. The wafer is frequently attached to the wafer carrier part by means of a clamp ring, the surface of the thus clamped wafer is the surface that is to be polished. The surface of the rotating wafer is brought in intimate contact with the rotating polishing pad while a slurry is distributed over the surface that is being polished. The chemical slurry, which may also include abrasive materials therein, is maintained on the polishing pad to modify the polishing characteristics of the polishing pad in order to enhance the polishing of the substrate.

The use of chemical mechanical polishing to planarize semiconductor substrates has not met with universal acceptance, particularly where the process is used to remove high elevation features created during the fabrication of microelectronic circuitry on the surface of the substrate. One primary problem which has limited the use of chemical mechanical polishing in the semiconductor industry is the limited ability to predict, much less control, the rate and uniformity at which the process will remove material from the substrate surface. As a result, CMP is a labor-intensive process because the thickness and uniformity of the substrate must be constantly monitored to prevent over-polishing or inconsistent polishing of the substrate surface.

One factor, which contributes to the unpredictability and non-uniformity of the polishing rate of the CMP process, is the non-homogeneous replenishment of slurry on the surface of the substrate and the polishing pad. The slurry is primarily used to enhance the rate at which selected materials are removed from the substrate surface. As a fixed volume of slurry in contact with the substrate reacts with the selected materials on the surface of the substrate, this fixed volume of slurry becomes less reactive and the polishing enhancing characteristics of that fixed volume of slurry is significantly reduced. One approach to overcoming this problem is to continuously provide fresh slurry onto the polishing pad.

This approach presents at least two problems. Because of the physical configuration of the polishing apparatus, introducing fresh slurry into the area of contact between the substrate and the polishing pad is difficult. Providing a fresh supply of slurry to all positions of the substrate is even more difficult. As a result, the uniformity and the overall rate of polishing are significantly affected as the slurry reacts with the substrate.

FIG. 1 shows a Prior Art CMP apparatus. A polishing pad 12 is affixed to a circular polishing table 16 which rotates in a direction indicated by arrow 20 at a rate in the order of 1 to 200 RPM. A wafer carrier 14 is used to hold wafer 10 face down against the polishing pad 12. The wafer 10 is held in place by applying a vacuum to the backside of the wafer (not shown). The wafer carrier 14 also rotates as indicated by arrow 19, usually in the same direction as the polishing table 16, at a rate on the order of 1 to 200 RPM. Due to the rotation of the polishing table 16, the wafer traverses a circular polishing path over the polishing pad 12. A force 18 is also applied in the downward vertical direction against wafer 10 and presses the wafer 10 against the polishing pad 12 as it is being polished. The force 18 is typically in the order of 0 to 15 pounds per square inch and is applied by means of a shaft 16 that is attached to the back of wafer carrier 14. Slurry 13 is provided to the top of the polishing pad 12 to further enhance the polishing action of polishing pad 12.

The Prior Art method that has been highlighted in FIG. 1 encounters a number of problems and concerns. For instance, abrasive polishing particles are lodged in and held by the polishing pad. By using the polishing pad, the fibers of the polishing pad deteriorate, causing the abrasive particle retention within the polishing pad to diminish, reducing the polishing characteristics of the polishing pad. Also, due to the pressure that is applied to the wafer, the contact between the polishing pad and the wafer is intense and does not allow for an even distribution of the polishing slurry across the surface that is being polished. Also, the abrasive particles that essentially affect the polishing action are, during the polishing process, reduced in size, further affecting the polishing characteristics of the process.

FIG. 2a and 2b give and example of the application of the process of CMP in the creation of a semiconductor device. The example that is shown in FIGS. 2a and 2b is characterized by its simplicity and can therefore readily be extended to more complex CMP applications. For all of these applications, the operation is essentially as the example that has been shown in FIGS. 2a and 2b. Over a semiconductor surface 10, for instance the surface of a silicon substrate, a layer 22 of for instance silicon nitride is deposited, patterned and etch, creating openings or trenches through the layer 22 and into the underlying semiconductor surface. These trenches have been filled with an overlying layer 24, for instance comprising silicon oxide. It is the objective to fill the trenches that have been created in layer 22 and the underlying semiconductor surface with a material. To achieve this objective, it is clear from FIG. 2a that the layer 24 must be removed from above the plane that contains the surface of layer 22. CMP is therefore applied to the surface of layer 24, removing this layer starting from the surface of the layer 24 and proceeding until the surface of layer 22 is reached. The results of the CMP process is shown in FIG. 2b, indicating that the objective of filling the trenches that have been created through layer 22 and into the surface 10 has been achieved. Numerous variations of the simplified example, shown in FIGS. 2a and 2b, of a processing environment where CMP can be applied need not be further detailed at this time, since these variations may change in particulars but not in the essential process as shown in FIGS. 2a and 2b.

Where FIGS. 1, 2a and 2b have shown, in principle and in simplified form, the methods that are used to affect surface polishing, an equally important aspect of the CMP process is to observe the status and results that are obtained during and after the process of CMP. The invention provides a method that addresses semiconductor surface polishing during and at the end of the process of CMP.

U.S. Pat. No. 6,074,517 (Taravade) shows a method and apparatus for detecting CMP end-points by an infrared signal.

U.S. Pat. No. 6,020,264 (Lustig et al.) show a CMP thickness determining method.

U.S. Pat. No. 5,985,679 (Beman) shows a CMP end-point detection system.

U.S. Pat. No. 5,868,896 (Robinson et al.) show a CMP Method and end-point system.

SUMMARY OF THE INVENTION

It is an objective of the invention to determine a "best-can-do" end-point signal curve during the polishing of a film of a particular thickness, whereby the end-point signal curve is characteristic of the thickness of the film that is being polished.

It is another objective of the invention to make use of monitoring the current that is used to drive a rotating part that is used to polish a semiconductor surface and to therefrom derive a current vs. time curve that is best suited for determining that the CMP end-point has been reached for a layer of a particular thickness.

A new method is provided for determining the optimum film thickness of a film that is to be deposited over a semiconductor surface. The invention observes the electrical current and the therefrom resulting torque that is supplied to a rotating part of a polishing apparatus, from this the CMP end-point can be determined for a reference film that has been deposited. This technique is known as the "CMP end-point detection" technique. The invention addresses observing CMP end-point curves for films of various thicknesses and compares these CMP end-point curves of one film thickness with each other and calculates a deviation for multiple layers (deposited on different wafers) of that film thickness. The process is repeated for different film thicknesses. The film thickness that has a deviation of the CMP end-point curve that closest resembles an optimum deviation is the film thickness that is selected as having the optimum thickness for the deposition of that film.

BRIEF DESCRIPTION OF THE DRAWINGS

FIG. 1 shows a Prior Art method of chemical Mechanical Polishing.

FIGS. 2a and 2b show a cross section of a surface that is polished using Prior Art methods, as follows:

FIG. 2a shows a cross section prior to the process of CMP,

FIG. 2b shows a cross section at the completion of the process of CMP.

FIG. 3 shows a characteristic CMP end-point signal profile that can be observed at that relates to a layer that is polished, providing a method for monitoring the progress or status of the polishing process.

DESCRIPTION OF THE PREFERRED EMBODIMENTS

Figure 4:
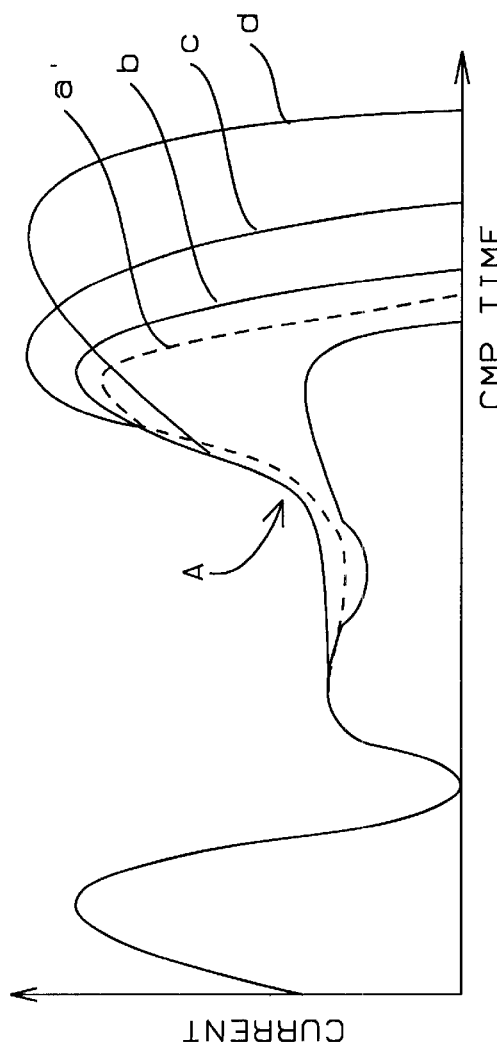
FIG. 4 shows a first set of four current-versus-time curves that apply to the polishing of a layer (with a constant "come from" and constant "go to" chemical composition) whereby the layer has been analyzed having four different thicknesses.

In accordance with the objectives of the invention a new method is provided for the determination of optimal thickness for the layer to be planarized. As part of and during the process of the invention, the electrical current and the therefrom resulting torque that is supplied to a rotating part (such as a wafer carrier or a polishing platen) is observed during the polishing operation. This current/torque will, due to the nature of the surface that is being polished and the status or progress of the polishing, be dependent on the force that is exerted on the surface that is being polished. When this surface therefore changes (by for instance having completed the removal of a layer and reaching the surface of an underlying layer), it can be expected that the current/torque profile changes. This change in current/torque at the time that an underlying interface has been reached is referred to as the CMP end-point signal curve. The current/torque profile is unique and recognizable at the time that an underlying interface is reached.

It is desirable for the process of CMP to have a minimum thickness of the layer that needs to be polished. The reasons for this are that too thin a layer means that inadequate fill is present to provide good trench filling and step coverage, too thick a layer means that the process of polishing is unnecessarily long. It is therefor to the advantage of the process of polishing that a film of a minimum thickness can be determined for a deposited layer so that:

the deposited film can be polished good step coverage and trench fill of the underlying surface is achieved after the deposited film has been polished, and the time required to polish the film is no longer than necessary.

It is therefore important to determine just the right thickness of a deposited layer (not too thin, not too thick, for reasons previously stated). Once this minimum thickness is determined the film can, for future depositions, be deposited to this thickness with the assurance that both a good film will be achieved after the process of CMP and that the process of CMP is not longer than it needs to be. To determine this minimum thickness, the film is deposited to a specific but different thickness on multiple wafers and, for each wafer, the film is polished until the CMP end-point signal profile is detected. If the film thickness is too low, the CMP end-point signal curves for the various wafers will never converge. If the film thickness is enough, the CMP end-point signal curves will converge or have small differences. The thickness of the film is therefore reduced until the film thickness is such that the CMP end-point curves deviate no more than an acceptable amount. At that time it can be concluded that the film thickness that has been used is the thinnest film thickness that can be used and that can be polished using the CMP end-point signal profile as the indicator that the polishing must be stopped.

It must be pointed out that the steps that have been highlighted above are performed for one polishing environment at a time. That is the only parameter that is varied during these steps is the thickness of the deposited film, all other parameters remain unchanged in going from one film thickness to another. This means that not only do polishing control parameters (slurry content and speed of slurry feed, rotational speeds, pressure applied, temperature, etc.) not change but the chemical composition of the deposited film and the surface over which the film is deposited remain the same. The steps therefore apply for the deposition of a particular film (such as silicon dioxide) over a particular surface (such as the surface of a silicon substrate in which trenches have been created to a certain density and filled with a certain conductive material such as copper). Where any of these conditions change, a new set of steps with a new and most likely different CMP end-point signal profile is performed.

One critical aspect of applying processes of CMP is the method that is used for monitoring the status or results of the CMP process. It must therefore be possible to examine the surface qualities of the surface that is being polished. Ideally, this observation or measurement of the surface that is being polished must be:

accurate,
simple,
fast,
continuous during the process of CMP,
able to identify end-point of the process of CMP,
reliable,
repeatable,
cost effective,
integratable into the process of CMP,
valid for multiple points spread across a large surface that is being polished,
independent of the processing conditions that have been applied to the surface that is being polished prior to the CMP process, among these conditions is the pattern density that has been created in the surface that is being polished,
independent of the thickness of the surface that is being polished, and
non-intrusive.

Conventional methods of observing the results of the process of CMP apply a method of visually observing the polished surface by using a Scanning Electron Microscope (SEM). A cross section is made of the surface that has been polished, the cross section is visually examined using the SEM as the tool of observation. The examination of the cross section of the polished surface measures surface parameters that identify the topography of the surface. For instance, where this surface overlies a trench that has been created in an underlying layer, the method may measure the thickness of the polished layer (at the lowest point) over the trench and (at the highest point) over the surrounding material in which the trench is embedded. This measurement can be extended over the crosscut of the surface so that variations (in the calculated measurements) between for instance the center of the surface and the perimeter of the surface can be observed. This approach clearly does not meet some of the ideal conditions for measuring the effects of CMP on a semiconductor surface such as being none-intrusive, being integratable into the process of CMP, being valid for multiple points spread across a large surface that is being polished and, arguably, being accurate, reliable and repeatable.

Another way of determining the end-point of a CMP process is by, based on previously obtained experimental data, allocating a certain amount of time for the CMP process to be in force and stopping the CMP process after this time period has transpired. Based on previous results, it should be possible to predict how much time is required to polish a particular surface, applying known conditions of polish. This method however readily exposes the surface that is being polished to over-polish (resulting in lost product) or under-polish (meaning that the process of polish has to be resumed over a time period that is difficult to predict).

A parameter that can be used for the extent to which a surface is reduced in thickness is a CMP end-point signal. By observing the current or torque that is applied to a rotating medium during the process of CMP, sudden, characteristic changes in this current or torque can be observed at the time when the polishing of a deposited film is complete as a consequence of which the content of the material that is being polished changes dramatically. These characteristic changes (in current/torque), when observed as a function of time, are referred to as a CMP end-point signal profile, and are indicative of the reaching of the end-point of the CMP process for a particular film that has been deposited over a particular surface.

The process of the invention uses, as indicated, CMP end-point signal profile to identify the moment in time at which the process of CMP has achieved the desired results. Extensive experiments have been conducted in support of this method, following are some of the observations that have been made during these experiments.

1) The CMP end-point signal profile is a profile of the current that is supplied to a torque-producing component of the CMP apparatus. This current is measured as a function of time while this current is supplied to a rotating or torque-creating component of a CMP apparatus (to drive a rotating or torque creating component). This profile of the current indicates that, when the CMP end-point profile is detected, the process of CMP must be ended.

2) The CMP end-point signal is best observed by plotting the current along the vertical or Y-axis, the CMP time along the horizontal or X-axis.

3) Under the same conditions of CMP, and the same conditions of film and surface that is being polished, the CMP end-point signal profile has a known and constant profile, when the film is thick enough. When the film is not thick enough, the CMP end-point curves of the various wafers will vary considerably.

4) For a particular film that is deposited over a particular surface, the CMP end-point signal profile can be observed and recorded. Conventional SEM analysis can confirm which CMP end-point signal profile best reflects "best end results" of the CMP process. For additional depositions of an identical film over an identical surface, this "best results" CMP end-point signal profile is used to indicate when a deposited film has been polished to where again "best end results" of the CMP process have been achieved, in effect replacing SEM analysis with the observation of the (torque) current vs. (polishing) time and identifying from this the (previously established and recorded) CMP end-point signal profile.

More specifically will be addressed at this time the characteristics of the CMP end-point signal vs. time, see FIG. 3. The example that is shown in FIG. 3 is representative of the relationship between current/torque vs. CMP polishing time. Current vs. time relationships have been observed for layers of various thicknesses where these layers are polished under identical conditions of polish and identical conditions of the surface or layer that is being polished and identical conditions of surface to which the polish must proceed. The latter conditions are mainly conditions of the material that is contained in the layer and the processing conditions that the surface has been subjected to before the surface is polished. Conditions of polish are the standard conditions that have previously been addressed under FIG. 1. For instance pressure applied to the surface that is being polished, absolute and relative rotational speed of the rotating wafer surface and the rotating polishing pad, slurry parameters such as slurry content (chemical composition), temperature and distribution.

Two points can clearly be identified in the curve that is shown in FIG. 3, that is:

point A, the point where the current vs. time curve starts to rise relatively steeply point B, the point where the steep rise in the current vs. time curve ends and changes into a steep decline.

Point A has been identified as the point where the planarization has been almost completed and is therefore also referred to as the point where a "pre-planarized" (almost planarized) surface has been reached. Point B is the point where the planarization is complete and therefore must be halted. Using the polishing of a tungsten surface as an example, if polishing is continued after reaching point B, the surface of the metal (tungsten) film will become exposed (patch-like oxide will become visible).

It must further be stated and relating to end-point signal profiles that an end-point profile will typically be dependent on and will vary with different materials (for the film that is being polished and for the surface over which the film has been deposited). For example, the end-point signal for a tungsten layer will first show a peak after which the curve decreases at the time that the polished layer has reached a desired thickness. By contrast, other deposited films may have other profiles and may for instance have a valley in the end-point signal curve.

FIG. 4 shows a set of current vs. time curves that have been established for various film thicknesses that were polished, all other parameters that affect the polishing operation having been held constant for the polishing results that are shown in FIG. 4, as follows:

1) curve "a" represents the current vs. time for a layer (a deposited film that must be polished to a certain level) with a initial thickness of 4,000 Angstrom
2) curve "a" represents the same film thickness as the film thickness of curve "a" but the film is deposited on a different wafer
3) curves group "b" represent the current vs. time for a layer with an initial thickness of 4,500 Angstrom on multiple wafers
4) curves group "c" represent current vs. time for a layer with an initial thickness of 5,000 Angstrom on multiple wafers, and
5) curve group "d" represent the current vs. time for a layer with an initial thickness of 5,500 Angstrom on multiple wafers.

This is a clear indication that, for optimum results under the invention, the layer that is being polished must initially have a certain thickness which is larger than 4,000 Angstrom in order to be able to derive a clearest CMP end-point signal.

Figure 5:
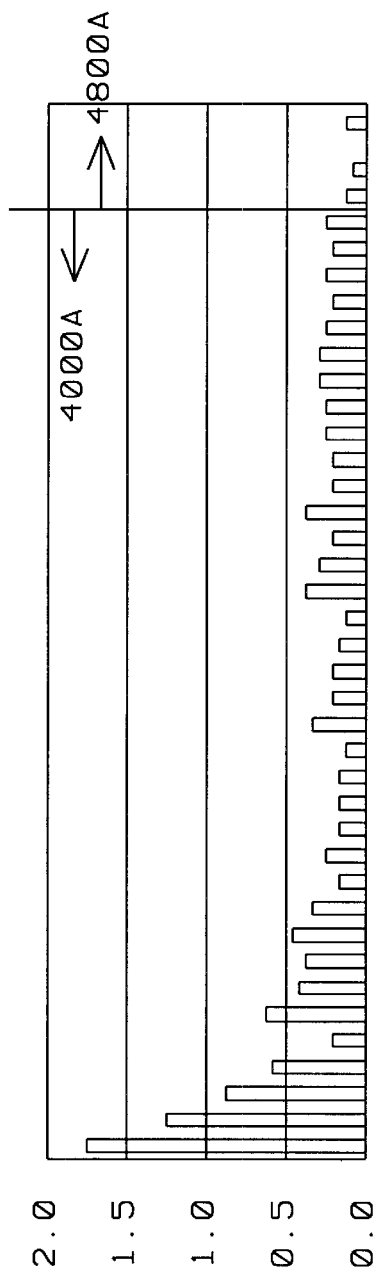
FIG. 5 shows a yield improvement graph that highlights the results of the method of the invention that can be obtained when polishing layers of a certain thickness.

This latter point is further emphasized by the block diagram that is shown in FIG. 5, which presents the improvements that can be obtained using the invention dependent on the initial thickness of the layer that is being polished. The horizontal parameter of the graph presents a particular lot of, going from left to right, incrementally increased initial layer thickness. The vertical axis of the graph shows the thickness of the layer that remains on the polished surface at the time that the CMP end-point signal profile is detected. It is clear from FIG. 5 that the most dramatic improvements (most of the layer being removed) are obtained for layers with an initial layer thickness in excess of 4,500 Angstrom.

The point that must be emphasized and that is shown in the curves that have been shown is that it is essential to the accuracy of the invention that, prior to the condition where the process of CMP must be stopped, a previously indicated "pre-planarized" layer must be present, that is the layer that is being polished must have a certain minimum thickness.

The invention is summarized at this time:

the objective is to determine a minimum film thickness that can be deposited (minimum for reasons of processing efficiency as stated above) and polished whereby the end-point of the polishing can be determined using an end-point detection curve select a thickness for a pre-planarized film deposition, a pre-planarized film is a film that has as yet not been polished deposit the pre-planarized films over the surface of several wafers to the selected thickness perform CMP's on the surface of the deposited films, on different wafers, observe and record the end-point profiles for this pre-planarized film compare the recorded end-point profiles of the pre-planarized films with each other. If the deviations of the recorded end-point profiles among the pre-planarized films are acceptable, the thickness of the pre-planarized film is determined as being the thickness to which this layer of pre-planarized film may be deposited so that CMP end-point detection can be used for termination of polishing of this film record the (minimum) film thickness and the corresponding end-point detection curve for this film. These data are used for future deposition and polishing of the film.

In sum, the invention provides a method and apparatus for end-point detection for a process of Chemical Mechanical Polishing (CMP) of a semiconductor surface, this process of CMP is applied to a surface of a layer created over a semiconductor surface. This layer must have a certain minimum thickness for the CMP end-point signal profile to be dependably detectable. The semiconductor surface is positioned in a polishing apparatus, the current/torque that is applied to the surface that is being polished is monitored and recorded as a function of polishing time, creating a current/torque vs. polishing time curve. Patterns of behavior in said current vs. polishing time curve are identified. The process of CMP of the surface is initiated, also initiated is the monitoring and recording of the current as a function of the polishing time. The process of CMP is terminated after the CMP end-point signal profile has been identified. The invention therefore allows for the determination of the minimum thickness that a particular film (that is to be polished, to a particular surface) must have so that the CMP end-point signal profile can be used to determine when the process of CMP must be ended.

Figure 6:
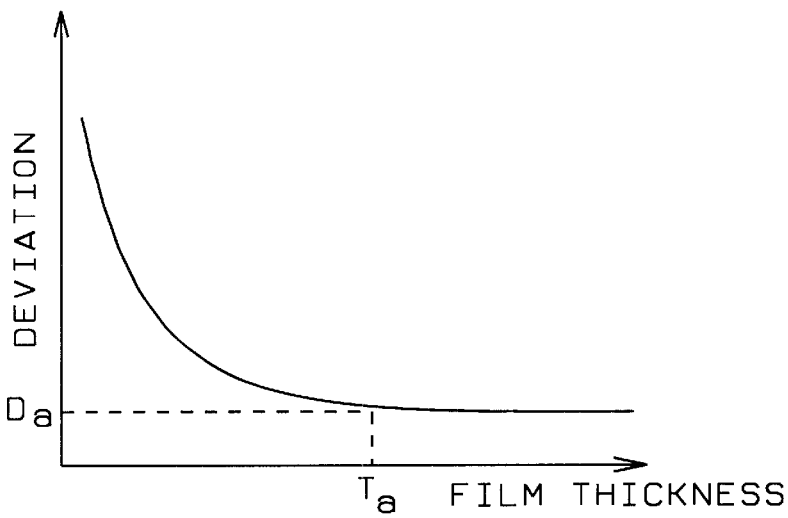
FIG. 6 shows a curve of observed deviation of end-point curves vs. the original thickness of the polished layer.

FIG. 6 shows a curve that relates the deviation of the end-point curve for a pre-planarized film as a function of the thickness of the pre-planarized curve. The deviation of the end-point curves has been plotted along the vertical or Y-axis, the film thickness has been plotted along the horizontal or X-axis. This deviation decreases as the thickness of the deposited film is increased, to the point where the deviation is acceptable at which point an acceptable thickness of deposited film is determined. The acceptable deviation is highlighted as $D_a$, the therewith corresponding acceptable film thickness is highlighted as $T_a$.

The deviation in the end-point curves is measured by averaging the differences of the current/torque at different polishing times.

Figure 7:
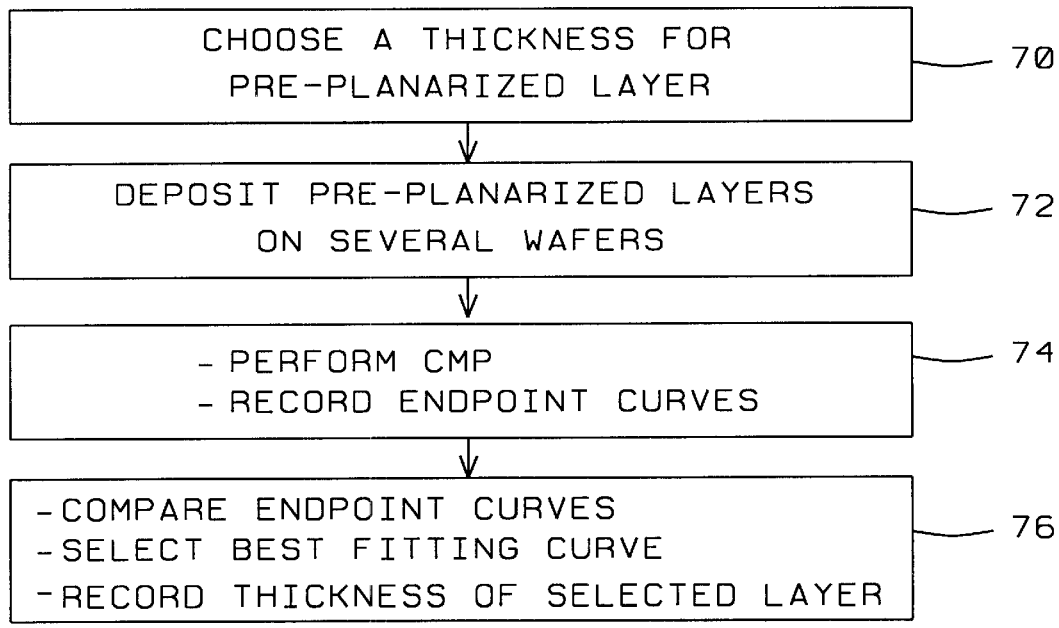
FIG. 7 shows a flow diagram of the invention.

An overview of the invention is provided in FIG. 7, which shows the flow diagram of the invention.

FIG. 7 shows a flow chart of the invention. FIG. 7 step 70 shows that a thickness is selected for a film that is to be deposited, forming a pre-planarized layer. FIG. 7, step 72 shows that this film is deposited over the surface of several wafers to the selected thickness. FIG. 7, step 74 shows that the surface of the deposited pre-planarized films are polished using CMP, the end-point signal curves for the polished films are observed and recorded. FIG. 7, step 76 shows that the recorded end-point curves for the films are compared with one another to observe the variations. If these end-point signal curves resemble one another within acceptable limits, the selected film thickness becomes the thickness to which this film could be deposited in future processing steps. The end-point signal curve of this film is recorded with the film thickness.

To summarize:
experiments are performed to determine the minimum thickness of a deposited film such that the CMP end-point signal profiles of the thickness of various wafers resemble each other and converge.

To further summarize the invention:
1) a semiconductor surface is provided, trenches have been formed in the semiconductor surface thereof, the trenches have been filled with a conductive material
2) a polishing apparatus is provided
3) semiconductor surfaces over which films of identical thicknesses have been deposited, these semiconductor surface belong for purposes of the invention to one batch or lot of surfaces
4) Chemical Mechanical Polishing is performed of the surface of each of said films of the semiconductor surfaces, torque or current applied to a rotating part of said polishing apparatus is recorded, a CMP end-point signal profile in said current vs. time curve is identified for each of the films of the lot
5) the CMP end-point signal profiles for all of the films of the lot are compared by measuring the deviation of the CMP end-point signal profiles for all of said films of said lot
6) the above steps are repeated for different film thicknesses in different lots, creating a multiplicity of deviations of the CMP end-point signal profiles in said current vs. time curve for said multiplicity of lots
7) from said multiplicity of deviations a deviation and therewith a final lot is determined whereby the deviation is a minimum or optimum value, resulting in a selected CMP end-point signal profile, and
8) the selected CMP end-point signal profile is correlated with a film thickness of the films of said final lot, providing a thickness at which the films must be deposited in order to provide a dependable CMP end-point signal profile during a process of CMP of this film.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for determining minimum thickness of a deposited film, comprising:

providing a semiconductor surface, said semiconductor surface having been provided with trenches in the surface thereof, said trenches having been filled with a conductive material;

providing a polishing apparatus, said polishing apparatus comprising a wafer carrier for mounting said semiconductor surface and a polishing table for mounting a polishing pad, said wafer carrier and said polishing table being rotating parts of said polishing apparatus;

providing a lot of semiconductor surfaces over which films of identical thicknesses have been deposited;

performing Chemical Mechanical Polishing of the surface of each of said films of said lot of semiconductor surfaces, monitoring and recording torque or current applied to a rotating part of said polishing apparatus as a function of CMP time for each of said films of said lot of semiconductor surfaces, creating current vs. time curves for each of said films of said lot;

identifying a CMP end-point signal profile in said current vs. time curve for each of said films of said lot;

recording the CMP end-point signal profile in said current vs. time curve for each of said film of said lot;

comparing the CMP end-point signal profiles for all of said films of said lot, measuring a deviation of the CMP end-point signal profiles for all of said films of said lot;

repeating said steps of providing a lot of semiconductor surfaces over which films of a thickness have been deposited, whereby said thickness is a thickness that differs from all previously applied film thicknesses, said step to be repeated up through and including said step of comparing the CMP end-point signal profiles in said current vs. time curve for all of said films in said lot, further continuing said repetition for a multiplicity of lots, creating a multiplicity of deviations of the CMP end-point signal profiles in said current vs. time curve for said multiplicity of lots;

determining from said multiplicity of deviations of the CMP end-point signal profiles a deviation and therewith a final lot whereby said deviation between the CMP end-point signal profile in said current vs. time curve for all of said films in said final lot is a minimum or optimum value, resulting in a selected CMP end-point signal profile; and correlating said selected CMP end-point signal profile for said films with a film thickness of said films of said final lot, providing a thickness at which said films must be deposited in order to provide a dependable CMP end-point signal profile during a process of CMP of this film.

2. The method of claim 1 wherein said minimum standard or reference thickness of said first film has a measurable value.

3. The method of claim 1 wherein said trenches having been filled with a conductive material comprising a conductive material selected from a group that comprises but is not limited to copper, tungsten, titanium, tantalum, a silicate, a salicide, poly silicon, amorphous silicon or any other semiconductor compatible conductive layer.

4. The method of claim 1 wherein said semiconductor surface is selected from a group comprising but not limited to semiconductor substrates, printed circuit boards, flex circuits or a metallized or glass substrate or semiconductor device mounting support.

5. A method for determining minimum thickness of a deposited film such that completion of polishing of said film can be determined by monitoring a Chemical Mechanical Polishing (CMP) end-point signal profile, said CMP end-point signal profile comprising torque or current applied to a rotating part of a CMP apparatus as a function of CMP time at a time that said deposited film has been polished to completion, comprising:

provided a polishing apparatus, said polishing apparatus comprising a wafer carrier for mounting said semiconductor surface and a polishing table for mounting a polishing pad, said wafer carrier and said polishing table being rotating parts of said polishing apparatus;

providing a multiplicity of lots of semiconductor surfaces, each lot comprising a multiplicity of semiconductor surfaces having been provided with trenches in the surface thereof, said trenches having been filled with a conductive material over which layers of various thicknesses have been deposited with one thickness of layer being confined to one of said lots, whereby deposited film thicknesses vary between lots of said multiplicity of lots;

positioning at least one of said semiconductor surfaces in said polishing apparatus, further preparing said polishing apparatus for initiation of said process of CMP of said surfaces of said layers;

providing a current to a rotating part of said polishing apparatus;

monitoring and recording said current as a function of polishing time for each of said semiconductor surfaces in a lot of said multiplicity of lots of semiconductor surface;

initiating said process of CMP of said surface, therewith initiating said monitoring and recording said current vs. polishing time, thereby creating a multiplicity of CMP end-point signal profiles for said lot of semiconductor surfaces, calculating a deviation between all of said multiplicity of CMP end-point signal profiles for said lot of semiconductor surfaces, creating a deviation of said CMP end-point signal profiles for said lot;

repeating said initiating said process of CMP of said surface for a multiplicity of lots, thereby creating a deviation of said CMP end-point signal profiles for each lot of said multiplicity of lots, creating a multiplicity of deviations;

comparing said deviation of said CMP end-point signal profiles for said multiplicity of lots, selecting from said deviation of said CMP end-point signal profiles for said multiplicity of lots a deviation that has a minimum or optimum value thereby identifying a corresponding film thickness of said selected lot; and recording the thickness of said selected lot and the therewith selected CMP end-point profile.

6. The method of claim 5 wherein said semiconductor surface is selected from a group comprising but not limited to semiconductor substrates, printed circuit boards, flex circuits or a metallized or glass substrate or semiconductor device mounting support.

7. A method for optimizing pre-layer film thickness for use in Chemical Mechanical Polishing process, comprising:

providing on a multiplicity of surfaces providing a first film having a first film thickness;

providing Chemical Mechanical Polishing (CMP) of said first film;

monitoring and recording said polishing, using an end-point CMP profile that is activated by reaching a surface that is of a different composition than said first film, providing a multiplicity of CMP end-point profiles;

determining a deviation for said multiplicity of CMP end-point profiles for said first film;

repeating said providing Chemical Mechanical Polishing and monitoring and recording for second, third and more films having film thicknesses of either greater or lesser than said standard film, determining said deviation for said end-point CMP profile for each of said second, third and more films; and reviewing the deviation for said end-point CMP profile for each of the first, second, third and more CMP end-point profile and choosing an optimum profile, thereby choosing an optimum film thickness for the deposition of said film.

8. The method of claim 7 wherein said standard film thickness of said first film has a measurable value.

9. The method of claim 7 wherein said end-point detection process comprises monitoring torque or current applied to a rotating part of a CMP apparatus used for said Chemical Mechanical Polishing process as a function of polishing time, creating a current vs. polishing time curve, further detecting zero, positive and negative gradients in said current vs. polishing time curve, further detecting a known pattern of behavior in said current vs. polishing time curve for terminating said process of CMP.

10. The method of claim 7 wherein trenches have been created in said surface over which said first film has been provided, said trenches being filled with a conductive material comprising a conductive material selected from a group that comprises but is not limited to copper, tungsten, titanium, tantalum, a silicate, a salicide, poly silicon, amorphous silicon or any other semiconductor compatible conductive layer.

11. The method of claim 7 wherein said surface is selected from a group comprising but not limited to semiconductor substrates, printed circuit boards, flex circuits or a metallized or glass substrate or semiconductor device mounting support.

* * * * *